United States Patent [19]

Scherrer

[11] 4,165,584
[45] Aug. 28, 1979

[54] APPARATUS FOR LAPPING OR POLISHING MATERIALS

[75] Inventor: Raymond E. Scherrer, West Palm Beach, Fla.

[73] Assignee: International Telephone and Telegraph Corporation, Nutley, N.J.

[21] Appl. No.: 860,659

[22] Filed: Dec. 15, 1977

Related U.S. Application Data

[62] Division of Ser. No. 763,451, Jan. 27, 1977, Pat. No. 4,104,099.

[51] Int. Cl.$^2$ .............................................. B24B 7/22
[52] U.S. Cl. ................................. 51/131.1; 51/216 R
[58] Field of Search ................... 51/129, 131, 216 R, 51/216 T; 269/289, 280, 285; 29/413, 423

[56] References Cited

U.S. PATENT DOCUMENTS

| 2,142,057 | 12/1938 | Hulbert et al. | 51/131 B X |
| 2,772,521 | 12/1956 | Voytech | 51/129 |
| 3,448,510 | 6/1969 | Bippus et al. | 29/413 |
| 3,518,798 | 7/1970 | Boettcher | 51/131 C |
| 3,562,057 | 2/1971 | McAlister et al. | 29/423 |
| 3,727,282 | 4/1973 | Neary | 29/413 |

Primary Examiner—Harold D. Whitehead
Assistant Examiner—Robert P. Olszewski
Attorney, Agent, or Firm—John T. O'Halloran; Peter C. Van Der Sluys

[57] ABSTRACT

Wafers to be processed are mounted to a lapping plate of a lapping machine using a photosensitive thermoplastic material, such as a photoresist. In a preferred embodiment, the wafers are laminated to a dry film photopolymer disposed on a carrier sheet, after which the sheet is secured to the lapping plate using a pressed-fit hoop that stretches the carrier sheet across the surface of the lapping plate and holds the sheet secure about the perimeter of the plate.

7 Claims, 7 Drawing Figures

APPARATUS FOR LAPPING OR POLISHING MATERIALS

This is a division of application Ser. No. 763,451, filed Jan. 27, 1977 now U.S. Pat. No. 4,104,099.

BACKGROUND OF THE INVENTION

1. Field of the Invention

The present invention relates to polishing and lapping apparatus and, more particularly, to the mounting of material wafers to the lapping plate of a lapping machine.

2. Description of the Prior Art

The polishing and lapping steps utilized in the processing of materials such as glass and semiconductor wafers are both time-consuming and costly operations and when used in semiconductor processing the steps result in a high percentage of rejects. During all but the final processing steps for a semiconductor wafer, the wafer is maintained at a substantial thickness to reduce the likelihood of accidental breakage during processing and particularly during probe testing of the wafer. Prior to the scribing and breaking steps for dividing the wafer into individual semiconductor die, it is essential that the wafer thickness be reduced to make scribing and breaking easier. This process is commonly known as back-lapping wherein a substantial portion of the wafer is removed, by a grinding or lapping operation, from the back-side of the wafer.

Heretofore, the wafers were mounted face down on a flat lapping plate that usually is circular with a diameter of approximately twelve inches. The wafers were held in place on the lapping plate by a standard wax mounting process wherein the lapping plate was heated to the wax melting temperature and a layer of wax was formed on the flat surface, the wafers were then placed on the heated wax and clamped in position while the lapping plate cooled and the wax hardened. The excess wax then had to be removed so that no wax extended above or on the exposed back-side of the wafers. The back-side of the wafers was then ground off using a lapping slurry containing an abrasive such as $Al_2O_3$ or diamond paste for removing the semiconductor material.

After completion of the lapping process, the lapping plate and wafers were washed to remove excess lapping slurry and the plate was again heated to melt the wax, and the wafers were then removed from the lapping plate. Due to surface tension, the wafer usually had to be pried or slid off of the plate resulting in substantial damage to the active surface of the semiconductor wafers. Any sliding of the wafer on the lapping plate tended to scratch the front surface since much of the abrasive material remains embedded in the wax. Since the semiconductor devices are already formed on the front surface of the wafer, any amount of scratching will damage the devices and it is not uncommon to experience 30 to 50% rejects as a result of the back-lap process. After the wafer is removed from the waxed plate, the wafers must be cleaned with a solvent solution.

Aside from the substantial number of rejects experienced during the lapping process, the process is also extremely expensive and time-consuming. The lapping plate must first be heated to melt the wax, then fully cooled to provide good adhesion of the wafers to the plate and then again reheated for removal of the wafers. This procedure is, of course, quite time-consuming. The cleaning operation is also becoming increasingly expensive as the cost of solvent continues to rise.

Another difficulty that was encountered in the use of wax mounting was thickness control and planarity control. Due to the thickness variations of the wax layer, the wafers would have varying thicknesses and the surfaces were not always planar.

SUMMARY OF THE INVENTION

The present invention contemplates several improvements in material polishing and lapping apparatus. The invention is applicable to the processing of materials where slices or wafers of material are formed and must be lapped or polished on at least one side. These processes are typically used, as an example, in the manufacture of semiconductors and microchannel plates.

The invention will be described as it pertains to the semiconductor industry for the processing of wafers of semiconductor material and particularly the lapping of the wafers. However, it is to be understood that the invention also applies to the polishing of wafers.

In the preferred embodiment, test slices or wafers have shown substantially a 100% yield with no work damage resulting during the lapping operation. Thickness and planarity control are exceptional. In the preferred embodiment, the invention does not require the use of a solvent for cleaning the wafers and therefore the cost of the solvent is eliminated as is the adverse effect that result from solvent contact with the semiconductor material. The use of wax is eliminated in the preferred embodiment and therefore the process becomes substantially faster as the heating and cooling steps required in the prior art have been eliminated. Another totally unexpected result was also realized in the form of reduced lapping time. Due to the surface characteristics of the material used, there is less rotational drag in the lapping machine and higher speeds are achieved resulting in faster lapping. Thus, the present invention provides apparatus for lapping semiconductor wafers while providing substantial improvements in the yield.

In the most basic embodiment of the present invention, a liquid photoresist coating is provided on the face of the semiconductor wafer prior to wax mounting the wafer to the lapping plate. The liquid photoresist coating protects the surface of the wafer from both the abrasive material and solvent during removal and clean-up operation.

In a next embodiment of the invention, a number of wafers are laminated onto a dry film photoresist disposed on a carrier sheet which is subsequently wax-mounted to the face of the lapping plate. After the lapping process is complete, the lapping slurry is easily washed off the photoresist and the lapping plate is heated and the carrier is removed. The wafers may be removed from the photoresist by merely peeling the wafers off.

In the preferred embodiment of the present invention, the wafers are laminated to a dry film photoresist on a carrier sheet which is then spread over the surface of the lapping plate and held secure to the periphery of the lapping plate. The carrier sheet may be secured by an elastomeric O-ring or other similar device. A pressed-fit hoop has been found to be quite successful since it tends to stretch the photoresist sheet as it is pressed about the plate, thereby removing any wrinkles from said sheet and allowing for exceptional thickness control. Thus, the use of a dry film photoresist sheet provides for rapid mounting and removal of the wafers from the lapping plate without the need for chemical solvent and the heating steps of the prior art. A photoresist surface protects the face of the semiconductor wafer and work damge is substantially eliminated, resulting in higher yield of wafers having controlled thickness.

One objective of the present invention is to provide an apparatus for material lapping and polishing.

Another objective of the present invention is to increase the yield of semiconductor die after the lapping process.

Another objective of the present invention is to achieve better thickness control in the lapping operation.

The above mentioned and other features and objects of this invention will become more apparent by reference to the following description taken in conjunction with the accompanying drawings, in which:

DESCRIPTION OF THE APPARATUS

Figure 1:
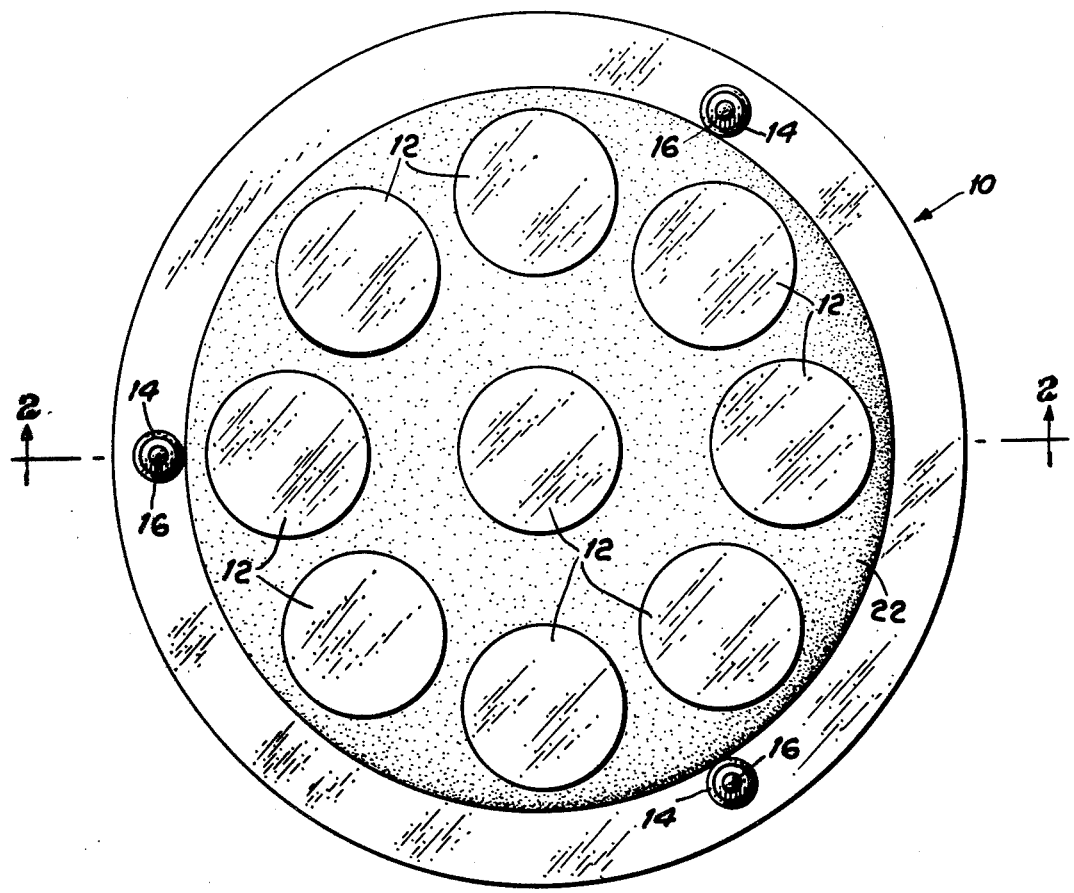
FIG. 1 is a plan view of a standard lapping plate showing a plurality of semiconductor wafers placed on the lapping plate.

Referring to FIG. 1, there is shown a plan view of a typical circular lapping plate 10 having mounted on the surface thereof a plurality of semiconductor wafers 12. Three adjusting screws 14 are equally spaced about the periphery of the lapping plate 10, each of said screws having a diamond point 16 mounted on the upper end. In the standard manner used in the art, screws 14 are adjusted to control the desired thickness of the wafers 12.

In accordance with this invention, the term "lapping plate" means the plate used to hold the article to be lapped and not the device which is to perform the lapping operation such as an abrasive wheel.

Figure 2:
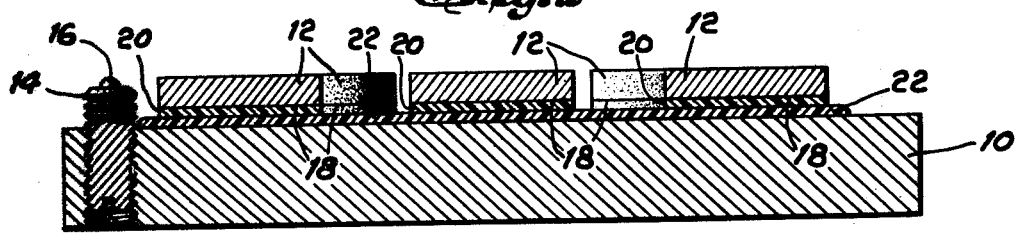
FIG. 2 is a sectional view taken along line 2—2 of FIG. 1 showing a first embodiment of the present invention.

Referring to FIG. 2, there is shown how the wafers 12 are mounted to the lapping plate 10 in a first embodiment of the present invention. The front face 18 of the wafer 12, the surface in which the components are formed, is coated with a liquid photoresist material 20, such as a photoresist provided by Hunt Chemical Company known as Waycoat 1C Resist Type 3. The photoresist coating 20 protects the face of the semiconductor wafer during the lapping process and also protects the wafer from the chemical solvent that is used to clean the wafer after lapping is completed. The photoresist coated wafers are then mounted to the surface of the lapping plate 10 using the standard wax mounting process wherein the lapping plate 10 is heated and a layer 22 of melted wax is formed over the surface as shown in FIG. 2. After the wax 22 is melted, the wafers 12 are placed so that the photoresist coating 20 is in contact with the melted wax, which is thereafter allowed to cool and harden to hold the wafers in place on the lapping plate.

The screws 14 are adjusted to provide the desired wafer thickness and the lapping process is then completed in the standard manner using standard lapping materials. After lapping is completed, the excess lapping slurry is washed off and the plate 10 is again heated to melt the wax 22 so that the wafers may be removed. The photoresist coating 20 protects the face 18 of the wafers from damage due to the abrasive and solvent used in the process. After the wafers are cleaned, the photoresist coating may be removed using standard photoresist processes.

Figure 3:
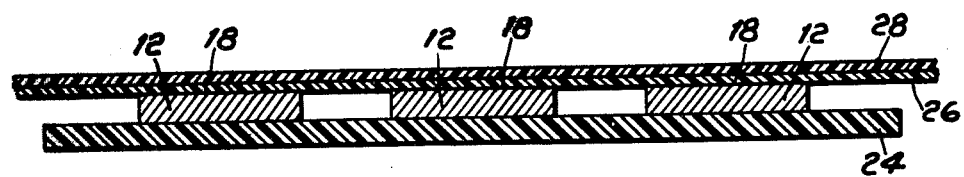
FIGS. 3 and 4 are sectional views showing intermediate steps in the mounting of semiconductor wafers to a carrier sheet.

Referring to FIG. 3, there is shown an improved embodiment of the present invention wherein a photoresist in the form of a dry film photopolymer on a carrier sheet is used instead of the liquid photoresist. The semiconductor wafers 12 are placed face-up on a mylar template 24 which is formed in a circular configuration simulating the surface of the lapping plate 10. Preferably, template 24 includes indicia to indicate the proper positioning of the wafers 12 so that the wafers will not interfere with the adjusting screws 14 when placed on the lapping plate surface. After the wafers are properly positioned on the template 24 with the front face upward, the wafers are laminated to the carrier sheet by passing the template and the wafers through a dry photoresist laminater so that the front surfaces 18 of the wafers adhere to the photoresist layer 26 which is supported by a carrier sheet 28 of polyester material such as mylar.

The invention is presently being practiced using a Dynachem Corporation Model 120 Dry Photoresist Laminater operating at a temperature below the recommended temperature (or about 175° F.) so that partial adhesion to the semiconductor wafer is achieved.

There are several dry film polymers that may be used in the practice of the present invention, such as photopolymer film resist provided by Dynachem Corporation that has a film thickness of 1 to 2 mils formed on a one-mil polyester carrier sheet with a one-mil polyethylene protective cover on the top surface. The recommended heating for such a dry film resist is 235° F.±10°; however, for purposes of the present invention, only partial heating to about 175° F.±10° F. should be used so that partial adhesion is achieved. The partially cured photoresist exhibits high shear strength but allows the wafers to be peeled off when tension is applied. Thus, the material is uniquely adapted for use in lapping machines where high shear is experienced but not tension.

A dry film photopolymer formed on a carrier was used for the practice of the present invention because it was conveniently available and the photopolymer is totally compatible with the semiconductor material and may be removed using solutions that are standard in the semiconductor art. The photosensitive characteristic of the material plays no part in the practice of the invention. The thermoplastic characteristic and compatibility with semiconductor materials are the important features of the polymer used. Other adhesives could be used in the practice of the invention which would require additional cleaning steps to remove the adhesives in a manner similar to the solvent cleaning required to remove the wax presently used.

After the template 24 is passed through the laminater, the template may easily be removed since the mylar does not adhere well to the photoresist as compared with the semiconductor wafers 12. The wafers 12 and carrier sheet 28 are then turned over as shown in FIG.

Figure 5:
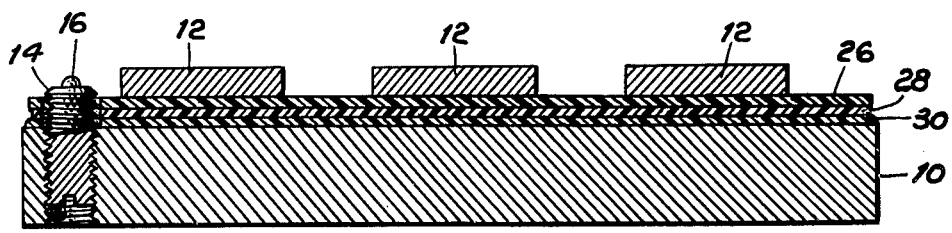
FIGS. 5, 6 and 7 are sectional views showing the various methods and apparatus for mounting the wafers to a lapping plate.

4 and are secured to a lapping plate 10 using the standard wax mounting process as previously described and now shown in FIG. 5, with the wax layer 30 disposed between the carrier sheet 28 and the surface of the lapping plate 10.

After the wafers have been lapped, the lapping plate is washed and reheated to melt the wax layer 30 and the carrier sheet is removed from the lapping plate. Due to the surface characteristics of the photoresist the lapping slurry is easily washed away with little or no abrasive remaining on or in the surface. The wafers are easily removed from the carrier sheet simply by peeling them off individually or the entire wafer carrier sheet assembly can be inversely placed on a vacuum table where a vacuum holds the wafers to the table while the carrier sheet is merely peeled from the wafers. Experience has shown that when proper laminating temperatures are used, no photoresist residue remains on the wafer surface; however, if some residue were to remain, it would be removed during a subsequent standard clean-up step wherein the wafer is washed in a hydrogen-peroxide-sulfuric acid solution.

The embodiment of the invention as previously described fully protects the surface 18 of the wafers from work damage and also eliminates the need for solvent cleaning of the wafers since the wax is not in contact with any portion of the wafer. The abrasive compound does not come in contact with the wax layer 30 and therefore it is possible to re-use the wax layer 30 without the need for cleaning and rewaxing of the surface of the lapping plate. Thus, the embodiment previously described substantially increases the yield by reducing work damage and to a degree, reduces the cost of the lapping process since the chemical solvents are not required.

It has been discovered that the lapping time can be substantially reduced as, for example, from 25 minutes of lapping to 14 minutes of lapping. This is a result of the faster speeds attained by the lapping machine. Due to the small distance between the lapping plates and the viscosity of the lapping slurry, significant drag was exerted on the rotating plates. Due to the surface characteristics of the photoresist and mylar, the lapping slurry does not wet the mylar and less drag is exerted resulting in higher lapping speeds and shorter lapping times. The embodiment previously described still requires the steps of heating and cooling the lapping plate so that the wax may melt and reharden to secure the carrier sheet to the lapping plate; therefore, the process is still rather time-consuming.

It is contemplated that the photoresist could be applied directly to the lapping plate and fully cured with the carrier sheet removed. The wafers could then be applied to the photoresist with moderate heat so that sufficient shear strength is provided while allowing for subsequent removal by lifting of the wafers. Developing solution would then be used for subsequent cleaning of the plate surface. A moderate amount of heat may be applied to soften the photoresist prior to removal of the wafers.

Figure 6:
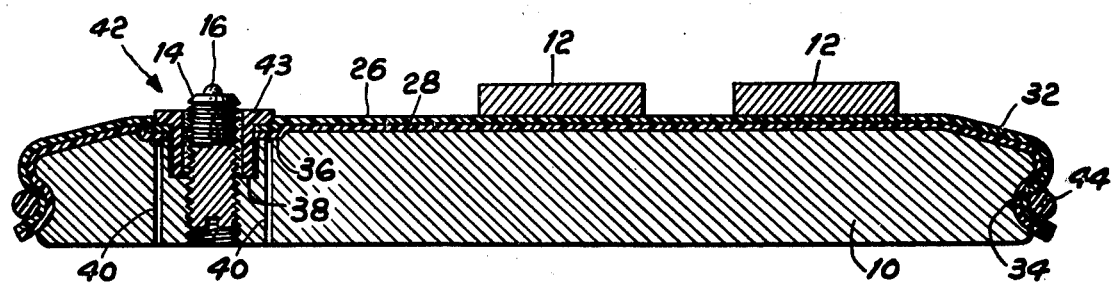

Referring to FIG. 6, there is an improved embodiment of the present invention wherein the need for wax is totally eliminated. The lapping plate 10 has been modified to provide a beveled edge 32 and a groove 34 about the entire periphery of the lapping plate. The threaded openings that receive the adjusting screws 14 were also modified to provide a circular recessed surface 36 about the threaded opening and a shoulder 38 formed approximately half-way through the threaded opening with the threads terminating at the shoulder 38, and the opening having a larger diameter above said shoulder. A pair of small diameter openings 40 are provided about each of said adjusting screws and extend entirely through the lapping plate 10, said openings terminating within the recessed circular surface 36. The purpose of the openings 40 will be discussed subsequently.

Figure 4:
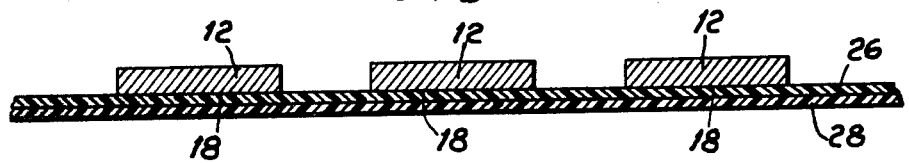

In practicing this embodiment of the invention, the wafers 12 are mounted to a carrier sheet as described and shown in FIGS. 3 and 4. Three holes are then formed in the carrier sheet and are located to coincide with the three adjusting screws 14. The holes may be formed in any of a number of ways; however, it has been found that the use of a hot wire is particularly useful since the melting carrier sheet forms a bead about the opening as it forms. The carrier sheet is then spread over the surface of lapping plate 10 so that the holes in the carrier sheet register with and fit around the adjusting screws. Plastic plugs 42 are then pressed into the space about the adjusting screws, said plugs have flanged upper surfaces 43 that engage the carrier sheet and hold it in place against the recessed surfaces 36. After the plugs 42 are properly inserted, the carrier sheet is folded down over the beveled edge 32 and groove 34 and a tight-fitting elastomeric O-ring 44 is used to hold the periphery of the carrier sheet in place about the groove 34 of the lapping plate 10.

It was discovered that the beveled edge 32 was useful in this embodiment since the carrier sheet tended to wrinkle and fold, forming pleats as it was turned down over the edge of the lapping plate. The pleats would have a substantial thickness extending above the lapping surface and interfering with the lapping operation and in most instances, being cut or severely abraded during lapping. Through the unique use of the beveled edge, the pleats form over the beveled surface and therefore do not interfere with the lapping operation. After the lapping is completed, the elastomeric ring 44 is removed and the plugs 42 are ejected using a bifurcated tool having a pair of pins that extend through the openings 40 to push plug 42 out of the recess. The wafers 12 are thereafter removed from the carrier sheet by merely peeling, and no solvent is required for the process. This embodiment of the invention provides all of the advantages of the previously mentioned embodiments and in addition requires no wax or solvent. Since wax is not required, excellent thickness control and planarity are realized. The dry film polymer has a fairly consistent thickness, thereby allowing for excellent thickness control of better than 0.5 mil tolerance.

Figure 7:
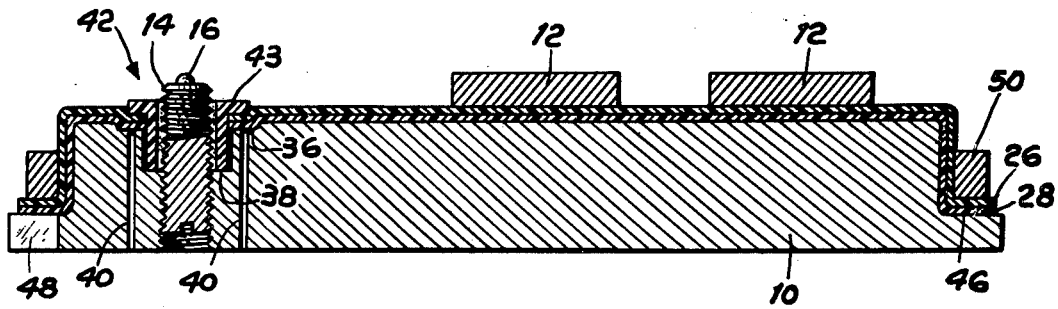

Referring to FIG. 7, there is shown the preferred embodiment wherein the lapping plate 10 is formed with an annular shoulder 46 formed about the periphery thereof, said shoulder having a plurality of notches 48 formed therein, the purpose of which will be described subsequently. An annular ring 50 is press-fit about the lapping plate 10 to tightly engage the carrier sheet between the ring 50 and the lapping plate. It has been discovered that a ring formed of a plastic material, such as Delrin, is entirely satisfactory for the practice of the present invention. Ring 50 may be manually pressed in place and subsequently removed by prying with a device, such as a screwdriver. One advantage of this embodiment over that shown in FIG. 6 is that it may be practiced with machine operated devices. It is contemplated that the ring be pressed on using a machine operated press and subsequently removed using a machine operated puller having fingers that fit into notches 48 and engage a lower surface of ring 50 for extracting the ring from about the lapping plate. The plugs 42 are inserted and removed as previously described for the embodiment of FIG. 6. It has been discovered that by using a tight-fitting ring 50 that is press-fit over the lapping plate 10, the carrier sheet is stretched slightly so that no wrinkles form on the surface of the lapping plate.

Using the present invention, substantially all of the work damage associated with the prior art has been eliminated and substantially 100% yields have been achieved during the lapping process. The mounting and removal procedure has been significantly simplified in that the time-consuming heating and cooling steps have been eliminated and there is no longer a need for the use of solvent to remove the wax from the lapped wafers. Thus, the cost of the operation has been reduced in that the solvent has been eliminated and the cost of energy for heating the lapping plate has also been eliminated. The time required to perform the operation has been substantially reduced since the wafers are almost instantaneously mounted to the lapping plate and long heating and cooling periods are not required. A significant advantage of the present invention is the substantial increase in yield of semiconductor die which, in itself, substantially reduces the overall cost of production of semiconductor devices. The invention also allows for better control of wafer thickness and planarity so that better quality die are produced.

While the present invention has been practiced using a photoresist and preferably a dry film photopolymer on a carrier, it is to be understood that the invention is not limited to the use of these specific materials. Other types of dry film polymers or thermoplastic adhesives could also be used in the practice of the present invention.

The advantage of a photosensitive polymer is that it breaks down when exposed to light and may then be washed away using developer rather than strong solvent solutions that would be required for other types of adhesives. It is clearly advantageous to avoid the need for a separate cleaning step to remove adhesive residue from the wafer. The material used must also have a high shear strength but low tensile strength so that the wafers may be peeled off without damage. Thermosensitive adhesives are preferred as opposed to adhesives that require the application of a solvent to soften the adhesive prior to applying the wafers. The photoresist type of dry polymer film is used because it is a convenient material readily available to those in the electronics art and is compatible with standard semiconductor processes.

While the principles of this invention have been described above in connection with specific embodiments, it is to be understood that this description is made only by way of example and not as a limitation on the scope of the invention as set forth in the objects and in the accompanying claims.

What is claimed is:

1. A lapping plate for mounting semiconductor wafers in a lapping machine, comprising:
   a body having a substantially flat upper surface;
   receiving means formed about the periphery of said body for receiving a retaining means;
   retaining means for cooperating with the receiving means for securing a carrier sheet between the retaining means and the receiving means;
   threaded adjusting means extending upwardly from the upper surface of said body for adjusting the thickness of the semiconductor wafers;
   a circular recessed surface formed about said adjusting means; and
   plug means for insertion into said recessed surface for engaging edges of openings formed in the carrier sheet and securing said edges to the body at said recessed surfaces.

2. A lapping plate as described in claim 1, wherein the receiving means comprises a groove formed about the periphery of the body and the retaining means comprises an elastomeric member adapted to fit securely in said groove.

3. A lapping plate as described in claim 1, wherein the receiving means comprises a peripheral surface having a cylindrical configuration and the retaining means comprises a ring press-fit over said cylindrical surface for securing the carrier sheet between the ring and the cylindrical surface.

4. A lapping plate as described in claim 3, additionally comprising a shoulder formed at the lower edge of the peripheral surface against which the ring abuts.

5. A lapping plate as described in claim 4, wherein the shoulder is discontinuous and formed of spaced segments so that access to the lower side of the ring is provided between the segments for removal of said retaining ring.

6. A lapping plate as described in claim 2, additionally comprising a beveled surface formed about the periphery of the body, said beveled surface merging into said top surface and into said groove, whereby pleats formed in the carrier sheet will form over said beveled surface and below the level of the upper surface of the lapping plate.

7. A lapping plate as described in claim 1, additionally comprising openings formed through said body beneath said recessed surface whereby ejecting means may be inserted for removing said plugs.

* * * * *